(12) United States Patent
Iacoponi et al.

(10) Patent No.: US 6,344,691 B1
(45) Date of Patent: Feb. 5, 2002

(54) BARRIER MATERIALS FOR METAL INTERCONNECT IN A SEMICONDUCTOR DEVICE

(75) Inventors: John A. Iacoponi, San Jose; Shekhar Pramanick, Fremont, both of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/664,863

(22) Filed: Sep. 19, 2000

Related U.S. Application Data

(62) Division of application No. 09/186,781, filed on Nov. 4, 1998, now Pat. No. 6,150,268.

(51) Int. Cl.[7] .......................... H01L 23/48; H01L 23/40
(52) U.S. Cl. ........................................ 257/751; 257/770
(58) Field of Search ........................... 438/685; 257/751, 257/770

(56) References Cited

U.S. PATENT DOCUMENTS 5,903,053 A * 5/1999 Iijima et al. ................. 257/751
6,130,156 A * 10/2000 Havemann et al. .......... 438/637

* cited by examiner

*Primary Examiner*—Caridad Everhart
(74) *Attorney, Agent, or Firm*—Mikio Ishimaru

(57) ABSTRACT

A semiconductor device is provided with a tantalum layer to line the channels and vias of a semiconductor, a tungsten nitride layer at a low temperature on the tantalum layer, and a copper conductor layer on the tungsten nitride layer. The tungsten nitride acts as a highly efficient copper barrier material with high resistivity while the tantalum layer acts as a conductive barrier material to reduce the overall resistance of the barrier layer.

6 Claims, 2 Drawing Sheets

BARRIER MATERIALS FOR METAL INTERCONNECT IN A SEMICONDUCTOR DEVICE

CROSS REFERENCE TO RELATED APPLICATION(S)

This is a divisional of application Ser. No. 09/186,781 filed on Nov. 4, 1998, now U.S. Pat. No. 6,150,268.

TECHNICAL FIELD

The present invention relates generally to semiconductors and more specifically to barrier materials used in semiconductor processing.

BACKGROUND ART

In the process of manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique, starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings. Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), titanium nitride (TiN), and tungsten nitride (WN) are used as barrier materials for copper. A thin layer of adhesion material, such as titanium, is first formed on the dielectrics or vias to ensure good adhesion and good electrical contact of the subsequently deposited barrier layer to underlying doped region and/or conductive channels. Adhesion/barrier material stacks such as tantalum/tantalum nitride (Ta/TaN) and titanium/titanium nitride (Ti/TiN) have been found to be useful as adhesion/barrier material combination for copper interconnects. In the case of WN, it has been found that no adhesion layer is necessary because WN adheres well to dielectrics, such as oxide, and because it is an amorphous material making it a desirable barrier material for copper processes.

The "barrier effectiveness" of a barrier material layer with respect to a conductive material is its ability to prevent diffusion of the conductive material. The barrier effectiveness of a barrier material layer is determined in part by its thickness, including the thickness uniformity, and its quality, including the number and sizes of defects such as pinholes which form on deposition. To resist copper diffusion, it is found that a minimum barrier material thickness of 5 nm is required. However, to minimize the electrical resistance due to the barrier material layer, it is desirable to maintain a thin barrier material layer. Therefore, it is typical to keep the barrier material layer thickness close to about 5 nm. While it is generally easy to maintain a minimum thickness of 5 nm at the bottom of the channels or vias, it is difficult to do so at the sidewalls of the channels or the vias. Occasionally, there may be insufficient barrier material thickness at the sidewalls which would allow copper to diffuse through, causing damages to adjacent devices.

Another important factor to the barrier effectiveness of a barrier material layer is its chemical composition. In the case of a WN barrier layer, an increase in its nitrogen content increases its barrier effectiveness. A WN barrier layer with a higher nitrogen content is preferred because the increase in barrier effectiveness compensates for the thickness non-uniformity or presence of pinholes and makes the layer more robust in preventing diffusion of conductive material therethrough. However, an increase in the nitrogen content would also undesirably increase the electrical resistance of the barrier layer.

Another problem with using WN as a barrier material layer is that the crystallographic texture of the overlying copper layer is poor which means that it has poor resistance to electromigration of the copper which in turn leads to voids in the copper. Essentially, copper atoms in the channels and vias tend to migrate with the flow of current and form voids when the grains of the crystalline structure of the copper are not closely aligned.

Even further, WN precludes using a low temperature process and the high temperature made it difficult to integrate with many low k dielectric materials.

Generally, with higher resistivity materials such as WN, there have been two major problems. First they lead to high interface resistance between the high resistivity material and the layers below it, for example the lower level copper interconnect. Second, the thicker the material, the higher the resistance simply passing through the bulk of the high resistivity layer.

A solution, which would provide WN layers that result in an increase in its barrier effectiveness without an increase in its electrical resistance and an improvement in the texture of the overlying copper layers, has long been sought, but has eluded those skilled in the art. As the semiconductor industry is moving from aluminum to copper and other type of materials with greater electrical conductivity and diffusiveness through dielectrics, it is becoming more pressing that a solution be found.

DISCLOSURE OF THE INVENTION

The present invention provides a semiconductor device with: a conductive barrier layer on a semiconductor wherein said conductive barrier layer is a refractory metal; a high barrier effectiveness barrier layer on said first conductive barrier layer wherein said high barrier effectiveness barrier layer includes a high resistivity metal; and a conductive layer on said second conductive barrier layer.

The present invention further provides a method for manufacturing a semiconductor device by: depositing a tantalum layer to line the channels and vias of a semiconductor; depositing a tungsten nitride layer at a low temperature on the tantalum layer; and depositing a copper conductor layer on the tungsten nitride layer. The tungsten nitride acts as a highly efficient copper barrier material with high resistivity while the tantalum layer acts as a conductive barrier material to reduce the overall resistance. The low temperature is selected to be compatible with the low k dielectric of the semiconductor.

The present invention further provides a method for forming barrier material layers and an associated structure with improved barrier effectiveness to copper diffusion.

The present invention provides a method for forming barrier material layers and an associated structure that has an improved texture in the overlying copper layers.

The present invention provides a method for forming barrier material layers and an associated structure that can be deposited at low temperatures compatible with low k dielectric materials.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
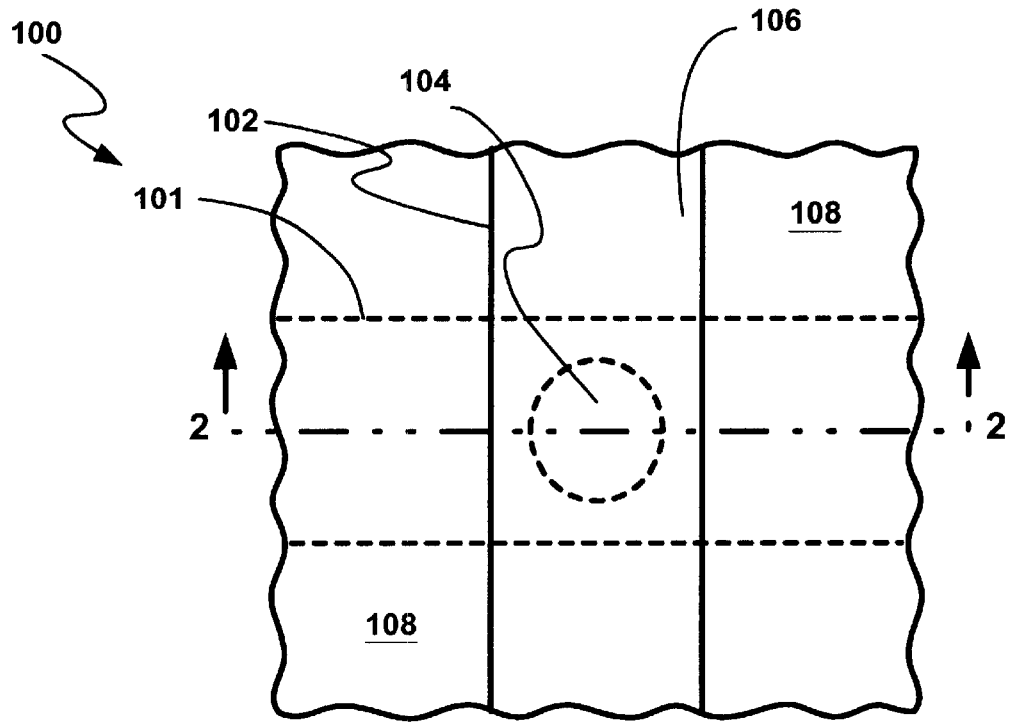
FIG. 1A (PRIOR ART) is a plan view of aligned channels with a prior art via.

Referring now to FIG. 1A (PRIOR ART), therein is shown a plan view of a prior art pair of perpendicularly aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material.

Figure 1B:
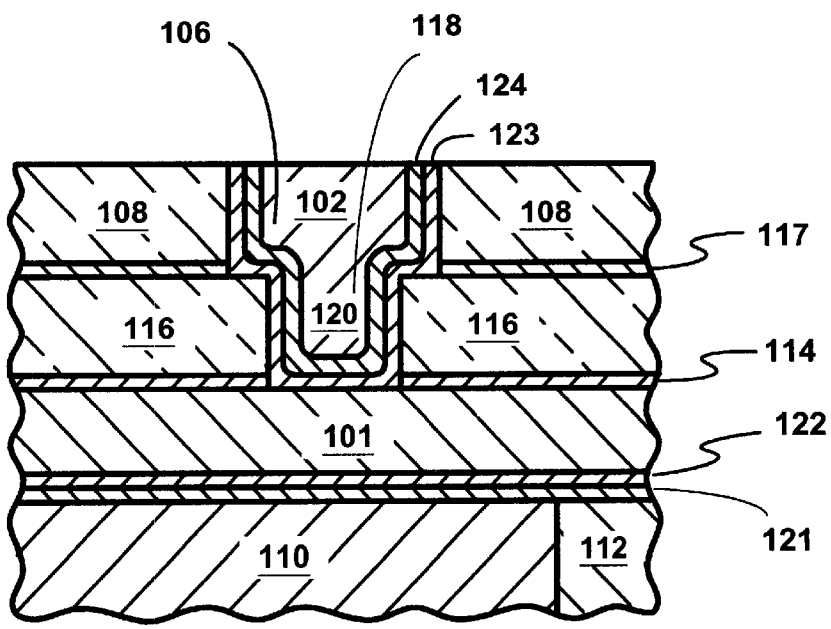
FIG. 1B (PRIOR ART) is a cross-section of FIG. 1A (PRIOR ART) along line 2—2.

Referring now to FIG. 1B (PRIOR ART), therein is shown a cross-section of FIG. 1A (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when, it is filled with the second conductive material.

Also shown disposed around the first channel 101 is adhesion material 121 and barrier material 122, and around the second channel 102 and the cylindrical via 120 is conductive adhesion material 123 and conductive barrier material 124. Barrier materials, where necessary, are used to prevent diffusion of the conductive materials into the adjacent areas of the semiconductor. Titanium nitride, tantalum nitride, and tungsten nitride are examples of barrier materials for copper channels.

The nitrogen component greatly increases the barrier effectiveness of the refractory metal over the pure metal, although it also increases its resistivity. As previously explained, to improve the adhesion of the barrier material to the underlying dielectrics, adhesion/barrier material stacks such as tantalum/tantalum nitride (Ta/TaN) and titanium/titanium nitride (Ti/TiN) are used as adhesion/barrier material combinations for copper channels.

Where WN has been used in the past, no adhesion material has been required or has been desired because WN adheres well to dielectrics, such as oxide and polysilicon. For purposes of clarity, the adhesion/barrier materials 121/122 and 123/124 are not shown in FIG. 1A (PRIOR ART).

WN is a desirable barrier material for copper interconnection because it has satisfactory barrier effectiveness to copper. However, it is difficult to optimize its barrier effectiveness by increasing its nitrogen content since an increase in the nitrogen content leads to an undesirable increase in the electrical resistance of the barrier layer. Another problem with using WN as a barrier material layer has been that the crystallographic texture of the overlying copper layer tends to have a crystal orientation where the grains are not closely aligned, which leads to poor resistance to electromigration.

Figure 2:
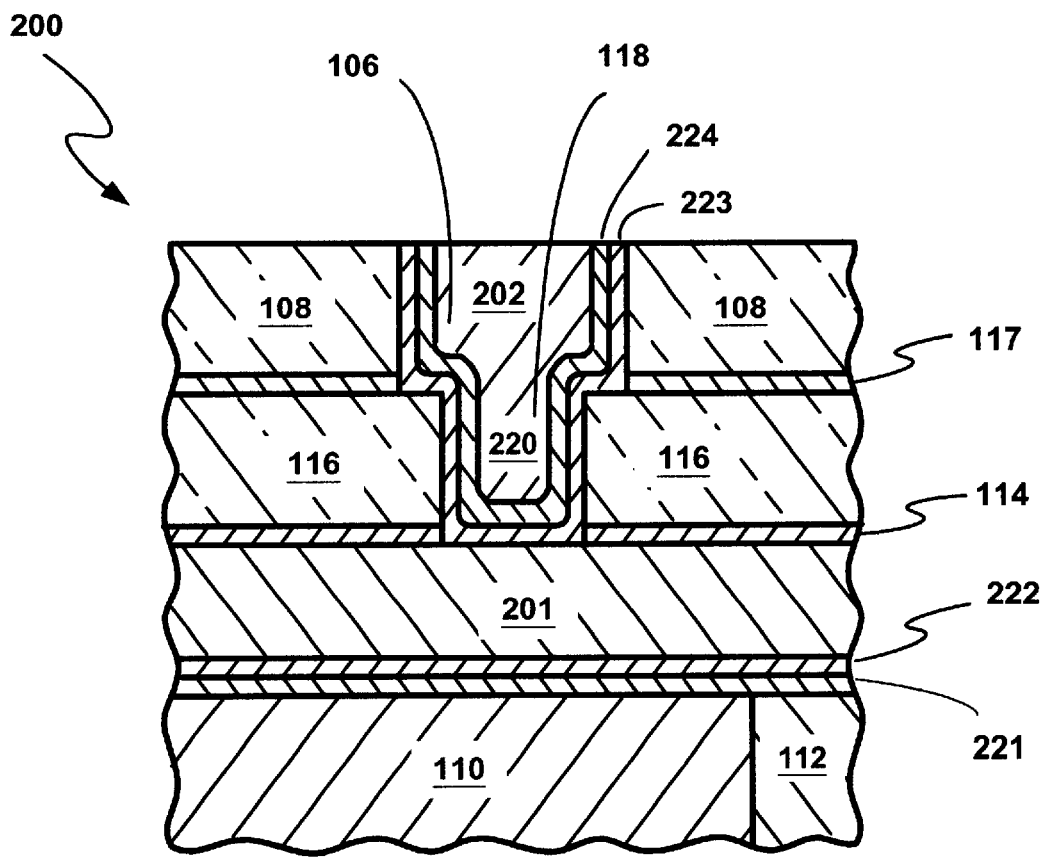
FIG. 2 is a plan view of aligned channels with a via formed in accordance with the present invention

Referring to FIG. 2, therein is shown the cross-section of a semiconductor wafer 200 with a pair of aligned semiconductor channels of a conductive material, such as copper, disposed over a silicon substrate 110 formed in accordance with the present invention. The present invention provides a method for forming an adhesion/barrier layer having high barrier effectiveness and low resistivity. The adhesion/barrier layer has a conductive barrier of Ta combined with a high nitrogen containing WN layer. For convenience of illustration, like reference numerals are used in FIG. 2 to denote like elements already described in FIG. 1. FIG. 2 is identical to FIG. 1 except that in this preferred embodiment, adhesion/barrier material stack 221/222 and 223/224 are formed of Ta/WN.

Unlike the conventional WN barrier layer which includes a nitrogen content by atomic concentration of about 30% the WN barrier layer formed according to the present invention contains a nitrogen content by atomic concentration of between 40% and 60%, and preferably between 45% and 55%. Due to the increase in nitrogen content, the WN barrier layer 222 and 224 has improved barrier effectiveness to copper diffusion. Even though the electrical resistance of the WN barrier layers 222 and 224 have increased because of the higher nitrogen contents, the high electrical conductivity of the Ta adhesion layers 221 and 223 offset the increase in electrical resistance. Thus the Ta/WN adhesion/barrier material stacks 221/222 and 223/224 formed in accordance with the present invention have electrical resistance value comparable to those found in the conventional WN barrier material layer in which WN barrier layer is used without an adhesion layer.

In addition, it has been determined that the texture of the overlying copper interconnection channels 201 and 202 have improved as a result of the use of Ta adhesion layers 221 and 223 underneath the respective barrier material layer 222 and 224. Accordingly, the present invention provides a method for forming a barrier layer which includes WN which has high barrier effectiveness compared to the prior art without an increase in its electrical resistance and at the same time causing improved texture in the overlying copper layers. This means that the copper grains are closely aligned to the same crystal orientation and thus better resist electromigration.

In production, a conventional first damascene process was used to put down over a production semiconductor wafer 200 a first channel 201 in a first channel oxide layer (not shown) above portions of a semiconductor device which is formed over a silicon substrate 110. The damascene process is a photolithographic process which uses a mask to define a first channel opening (not shown) in the first channel oxide layer to run in a first direction (which is horizontal in FIG. 1). The first channel opening is then lined with the barrier material of the present invention as will be described in detail for the second channel 202. The first channel opening is then filled with a first conductive material to form the first channel 201 using conventional metal deposition technique, such as physical vapor deposition, chemical vapor deposition, electroplating, or a combination thereof The stop nitride layer 114, the via oxide layer 116, and the via nitride layer 117 would be successively deposited on top of the first channel 201 and the first channel oxide layer using conventional deposition technique.

By using the via photoresist and the via photolithographic process followed by nitride etching of a round via opening 104 in the via nitride layer 117, the basis for the cylindrical via 118 was formed. The subsequent deposition of the second channel oxide layer 108 prepares the way for the second channel 106 to be perpendicular to the first channel 201.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 1 than in the horizontal direction. The nitride etch of the stop nitride layer 114 exposes a portion of the first channel 201 and completes the etching steps.

Thereafter, a thin layer of Ta adhesion material 223 is deposited in the second channel opening 106 and the cylindrical via opening 118, including along the walls of the second channel opening 106 and the cylindrical via opening 118. The thickness of the Ta adhesion material 223 is lines the second channel opening 106 and the cylindrical via opening 118.

Next, a thin layer of high nitrogen concentration WN barrier material 224 is deposited in the second channel opening 106 and the cylindrical via opening 118 and on top of the Ta adhesion material 223. The preferred process of deposition is chemical vapor deposition since it results in better step coverage and conformality. A W-bearing precursor, such as $WF_6$, is caused to react with an N-bearing precursor, such as N, $N_2$, $NH_3$, or $NF_3$, with or without the aid of plasma. The high nitrogen concentration permits the WN to be deposited at temperatures below 450° C. and even below 400° C. The WN barrier material 224 overlays the Ta adhesion material 223 in the second channel opening 106 and the cylindrical via opening 118. The deposition of the WN barrier material 224 is followed by the deposition of the second conductive material, such as copper, into second channel opening 106 and via opening 118 to form the second channel 202 and the cylindrical via 220.

The Ta adhesion material 223 is deposited using conventional deposition techniques, such as physical vapor deposition, chemical vapor deposition, or a combination thereof Similarly, the WN barrier material 224 is deposited using conventional deposition techniques, such as physical vapor deposition, chemical vapor deposition, or a combination thereof The second conductive material is deposited using conventional metal deposition technique, such as physical vapor deposition, chemical vapor deposition, electroplating, or a combination thereof. Thereafter, a chemical mechanical polishing process is used to complete the conventional connection process.

In a preferred embodiment, the WN barrier layer contains a nitrogen content by atomic concentration of between about 40% and 60%, and preferably between about 45% and 55%, and has a thickness of between 20 angstroms to 200 angstroms, and preferably between 50 angstroms to 100 angstroms. The corresponding Ta adhesion layer has a thickness of between about 10 angstroms to 200 angstroms, and preferably between about 20 angstroms to 50 angstroms.

Accordingly, the present invention provides a method for forming WN layers and an associate structure that have increased barrier effectiveness without an increase in its resistance and improved texture in the overlying copper layers.

While the best mode utilizes copper as the conductive material, it should be understood that the present invention is applicable to other high conductivity materials such as aluminum, doped polysilicon, copper, gold, silver, alloys thereof, and combinations thereof. Further, although the embodiments of the present invention are directed to using Ta as the adhesion material for WN barrier material, it also will be recognized by those skilled in the art that other refractory metals, such as titanium; refractory metal-containing materials; or tantalum-containing materials may be used to practice the present invention. Further, it is understood that a seed layer of conductive material may be deposited before the conductive material which fills the channels and vias is deposited.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor device, comprising:
    a semiconductor having channels and vias provided therein;
    a conductive barrier layer lining said channels and vias in said semiconductor wherein said first conductive barrier layer is a metal selected from a group consisting of tantalum, tungsten, an alloy thereof, and a combination thereof;
    a high barrier effectiveness layer lining said conductive barrier layer wherein said high barrier effectiveness layer comprises a tungsten nitride material wherein said high barrier effectiveness layer contains a barrier dopant of nitrogen between about 40% and 60% by atomic concentration; and
    a conductive layer formed on said high barrier effectiveness layer filling said channels and vias wherein said conductive layer is formed of a material selected from a group consisting of aluminum, copper, gold, silver, an alloy thereof, and a combination thereof.

2. The semiconductor device as claimed in claim 1 said high barrier effectiveness layer contains nitrogen of between about 45% and 55% by atomic concentration whereby the barrier effectiveness of said high barrier effectiveness layer is increased.

3. The semiconductor device as claimed in claim 1 said high barrier effectiveness layer is between 20 to 200 angstroms thick.

4. The semiconductor device as claimed in claim 1 said high barrier effectiveness layer is between 50 and 100 angstroms thick.

5. The semiconductor device as claimed in claim 1 said conductive barrier layer is between 10 to 200 angstroms thick.

6. The semiconductor device as claimed in claim 1 said conductive barrier layer is between 20 and 50 angstroms thick.

* * * * *